United States Patent
Vasquez et al.

(10) Patent No.: US 11,990,360 B2
(45) Date of Patent: May 21, 2024

(54) ELECTROSTATIC CHUCK (ESC) PEDESTAL VOLTAGE ISOLATION

(71) Applicant: Lam Research Corporation, Fremont, CA (US)

(72) Inventors: Miguel Benjamin Vasquez, Portland, OR (US); Vincent Burkhart, Cupertino, CA (US)

(73) Assignee: Lam Research Corporation, Fremont, CA (US)

(*) Notice: Subject to any disclaimer, the term of this patent is extended or adjusted under 35 U.S.C. 154(b) by 589 days.

(21) Appl. No.: 16/966,833

(22) PCT Filed: Jan. 30, 2019

(86) PCT No.: PCT/US2019/015865
§ 371 (c)(1),
(2) Date: Jul. 31, 2020

(87) PCT Pub. No.: WO2019/152528
PCT Pub. Date: Aug. 8, 2019

(65) Prior Publication Data
US 2021/0043490 A1   Feb. 11, 2021

Related U.S. Application Data

(60) Provisional application No. 62/624,619, filed on Jan. 31, 2018.

(51) Int. Cl.
*H01L 21/683* (2006.01)
*H01J 37/32* (2006.01)
*H01L 21/687* (2006.01)

(52) U.S. Cl.
CPC .... *H01L 21/6833* (2013.01); *H01J 37/32082* (2013.01); *H01J 37/32715* (2013.01);
(Continued)

(58) Field of Classification Search
CPC .......... H01L 21/6833; H01L 21/68757; H01L 21/68792; H01J 37/32082;
(Continued)

(56) References Cited

U.S. PATENT DOCUMENTS 2,491,167 A   12/1949  Drew
2,684,698 A    7/1954  Shaff
(Continued)

FOREIGN PATENT DOCUMENTS

CN   101495670 A   7/2009
CN   101542712 A   9/2009
(Continued)

OTHER PUBLICATIONS

English Machine Translation of Kawasaki et al. (WO2011099481A1) retrieved from ESPACENET Jan. 10, 2023 (Year: 2023).*
(Continued)

*Primary Examiner* — Ram N Kackar
*Assistant Examiner* — Laureen Chan
(74) *Attorney, Agent, or Firm* — Weaver Austin Villeneuve & Sampson LLP

(57) ABSTRACT

Various embodiments include an apparatus to retrofit into an electrostatic chuck (ESC) of an existing plasma-based processing system. The apparatus includes a tube adapter portion having a dielectric coating formed on an inner surface of the tube adapter portion to prevent arcing between high voltage electrodes within the tube adapter portion and a main body of the tube adapter portion during an operation of the plasma-based processing system, a number of insulative tubes with the high voltage electrodes to be enclosed therein, and an enlarged gap portion of the tube adapter portion proximate outboard ones of the plurality of insulative tubes to prevent arcing. Other methods of forming the ESC, and related devices, apparatuses, and systems are disclosed.

21 Claims, 10 Drawing Sheets

(52) U.S. Cl.
CPC .. *H01L 21/68757* (2013.01); *H01L 21/68792* (2013.01); *H01J 37/32577* (2013.01)

(58) Field of Classification Search
CPC ........... H01J 37/32715; H01J 37/32577; H01J 37/32477; H01J 37/32495; H01J 37/32504; H01J 37/32706
See application file for complete search history.

(56) References Cited

U.S. PATENT DOCUMENTS

| | | | |
|---|---|---|---|
| 3,895,832 | A | 7/1975 | Ellis et al. |
| 4,552,430 | A | 11/1985 | Myers |
| 4,692,836 | A | 9/1987 | Suzuki |
| 4,897,853 | A | 1/1990 | Argent |
| 5,463,526 | A | 10/1995 | Mundt |
| 5,507,874 | A | 4/1996 | Su et al. |
| 5,560,780 | A * | 10/1996 | Wu ..................... H01L 21/6831 118/728 |
| 5,633,073 | A | 5/1997 | Cheung et al. |
| 5,737,178 | A | 4/1998 | Herchen |
| 5,812,362 | A | 9/1998 | Ravi |
| 5,829,791 | A | 11/1998 | Kotsubo et al. |
| 5,841,624 | A | 11/1998 | Xu et al. |
| 5,942,282 | A | 8/1999 | Tada et al. |
| 6,066,836 | A | 5/2000 | Chen et al. |
| 6,072,685 | A | 6/2000 | Herchen |
| 6,081,414 | A | 6/2000 | Flanigan et al. |
| 6,104,596 | A | 8/2000 | Hausmann |
| 6,151,203 | A | 11/2000 | Shamouilian et al. |
| 6,213,478 | B1 | 4/2001 | Nishikawa |
| 6,221,221 | B1 | 4/2001 | Al-Shaikh et al. |
| 6,239,403 | B1 | 5/2001 | Dible et al. |
| 6,261,977 | B1 | 7/2001 | Tsai et al. |
| 6,403,491 | B1 | 6/2002 | Liu et al. |
| 6,466,881 | B1 * | 10/2002 | Shih ................... H01J 37/32477 702/33 |
| 6,592,709 | B1 | 7/2003 | Lubomirsky |
| 6,776,892 | B1 | 8/2004 | Ritzdorf et al. |
| 6,858,265 | B2 | 2/2005 | Redeker et al. |
| 6,879,051 | B1 | 4/2005 | Singh et al. |
| 7,625,227 | B1 | 12/2009 | Henderson et al. |
| 9,213,021 | B2 | 12/2015 | Plant et al. |
| 9,850,573 | B1 | 12/2017 | Sun |
| 10,079,154 | B1 | 9/2018 | Le et al. |
| 10,147,610 | B1 | 12/2018 | Lingampalli et al. |
| 10,403,535 | B2 | 9/2019 | Ye et al. |
| 10,431,467 | B2 | 10/2019 | Lingampalli et al. |
| 10,937,684 | B2 | 3/2021 | Horiuchi |
| 11,086,233 | B2 | 8/2021 | Topping et al. |
| 11,183,368 | B2 | 11/2021 | French et al. |
| 11,289,355 | B2 | 3/2022 | Gomm |
| 11,469,084 | B2 | 10/2022 | Thomas et al. |
| 2001/0019472 | A1 | 9/2001 | Kanno et al. |
| 2001/0027972 | A1 | 10/2001 | Yamaguchi et al. |
| 2003/0051665 | A1 * | 3/2003 | Zhao ..................... C23C 16/5096 712/42 |
| 2003/0180459 | A1 | 9/2003 | Redeker et al. |
| 2004/0074869 | A1 | 4/2004 | Wang et al. |
| 2004/0137169 | A1 | 7/2004 | Carollo |
| 2005/0042881 | A1 | 2/2005 | Nishimoto et al. |
| 2005/0183669 | A1 | 8/2005 | Parkhe et al. |
| 2005/0191827 | A1 | 9/2005 | Collins et al. |
| 2005/0213279 | A1 | 9/2005 | Hayakawa |
| 2005/0274324 | A1 | 12/2005 | Takahashi et al. |
| 2006/0005930 | A1 * | 1/2006 | Ikeda .................. H01L 21/6831 156/345.51 |
| 2006/0011611 | A1 | 1/2006 | Goto et al. |
| 2006/0081558 | A1 | 4/2006 | Collins et al. |
| 2006/0120011 | A1 | 6/2006 | Handa et al. |
| 2006/0158821 | A1 | 7/2006 | Miyashita |
| 2006/0237442 | A1 | 10/2006 | Goto et al. |
| 2006/0280875 | A1 | 12/2006 | Tomita et al. |
| 2007/0141729 | A1 | 6/2007 | Dhindsa et al. |
| 2007/0223173 | A1 | 9/2007 | Fujisawa et al. |
| 2007/0253139 | A1 | 11/2007 | Nakano et al. |
| 2007/0256786 | A1 | 11/2007 | Zhou et al. |
| 2008/0009417 | A1 | 1/2008 | Lou et al. |
| 2008/0029032 | A1 | 2/2008 | Sun et al. |
| 2008/0037195 | A1 | 2/2008 | Himori et al. |
| 2008/0062609 | A1 | 3/2008 | Himori et al. |
| 2008/0167720 | A1 | 7/2008 | Melkent |
| 2008/0236493 | A1 | 10/2008 | Sakao |
| 2008/0258411 | A1 | 10/2008 | Miura et al. |
| 2009/0059462 | A1 | 3/2009 | Mizuno et al. |
| 2009/0284894 | A1 | 11/2009 | Cooke |
| 2009/0314208 | A1 * | 12/2009 | Zhou ................. H01L 21/67103 118/723 R |
| 2010/0039747 | A1 | 2/2010 | Sansoni et al. |
| 2010/0104852 | A1 | 4/2010 | Fletcher et al. |
| 2010/0126847 | A1 | 5/2010 | Dhindsa et al. |
| 2010/0323124 | A1 | 12/2010 | Vartabedian et al. |
| 2011/0031217 | A1 | 2/2011 | Himori |
| 2011/0096461 | A1 | 4/2011 | Yoshikawa et al. |
| 2012/0044609 | A1 | 2/2012 | Cooke et al. |
| 2012/0164834 | A1 * | 6/2012 | Jennings ........... H01L 21/67201 118/723 R |
| 2012/0247678 | A1 | 10/2012 | Takahashi et al. |
| 2013/0070384 | A1 | 3/2013 | Cooke et al. |
| 2013/0087447 | A1 | 4/2013 | Bodke et al. |
| 2013/0126206 | A1 | 5/2013 | Zhou et al. |
| 2013/0155569 | A1 | 6/2013 | Suuronen et al. |
| 2014/0048720 | A1 | 2/2014 | Hayakawa et al. |
| 2014/0069585 | A1 * | 3/2014 | Aoto ................. H01J 37/32807 156/345.52 |
| 2014/0087587 | A1 * | 3/2014 | Lind ................. H01J 37/32532 439/527 |
| 2014/0118880 | A1 | 5/2014 | He et al. |
| 2014/0154465 | A1 | 6/2014 | Sun et al. |
| 2014/0159325 | A1 | 6/2014 | Parkhe et al. |
| 2014/0177123 | A1 | 6/2014 | Thach et al. |
| 2014/0203526 | A1 | 7/2014 | Banda et al. |
| 2014/0334060 | A1 | 11/2014 | Parkhe et al. |
| 2014/0355169 | A1 | 12/2014 | Maeta et al. |
| 2014/0356538 | A1 | 12/2014 | Schmitt et al. |
| 2015/0044947 | A1 | 2/2015 | Lu et al. |
| 2015/0116889 | A1 | 4/2015 | Yamasaki et al. |
| 2015/0179412 | A1 * | 6/2015 | Chhatre ............ H01J 37/32715 156/345.52 |
| 2015/0228528 | A1 | 8/2015 | Behdjat |
| 2015/0241783 | A1 | 8/2015 | Carcasi et al. |
| 2015/0311043 | A1 | 10/2015 | Sun et al. |
| 2015/0311105 | A1 | 10/2015 | Sadjadi et al. |
| 2015/0311108 | A1 | 10/2015 | Horiuchi |
| 2015/0323050 | A1 | 11/2015 | Ohno |
| 2015/0371876 | A1 | 12/2015 | Terauchi et al. |
| 2016/0002779 | A1 * | 1/2016 | Lin ................... H01J 37/32724 118/500 |
| 2016/0035610 | A1 | 2/2016 | Park et al. |
| 2016/0064264 | A1 | 3/2016 | Kulshreshtha et al. |
| 2016/0090650 | A1 | 3/2016 | Qian et al. |
| 2016/0111315 | A1 | 4/2016 | Parkhe |
| 2016/0196984 | A1 | 7/2016 | Lill et al. |
| 2016/0225652 | A1 * | 8/2016 | Tran ................... H01L 21/3065 |
| 2016/0281230 | A1 | 9/2016 | Varadarajan et al. |
| 2016/0333475 | A1 | 11/2016 | Gomm et al. |
| 2016/0336210 | A1 | 11/2016 | Cooke et al. |
| 2016/0336213 | A1 | 11/2016 | Gomm et al. |
| 2016/0340781 | A1 | 11/2016 | Thomas et al. |
| 2016/0343600 | A1 | 11/2016 | Parkhe |
| 2016/0372307 | A1 | 12/2016 | Yang et al. |
| 2017/0018411 | A1 | 1/2017 | Sriraman et al. |
| 2017/0040148 | A1 | 2/2017 | Augustino et al. |
| 2017/0103908 | A1 | 4/2017 | Lew et al. |
| 2017/0110358 | A1 | 4/2017 | Sadjadi et al. |
| 2017/0110385 | A1 | 4/2017 | Kawajiri et al. |
| 2017/0140970 | A1 | 5/2017 | Boyd, Jr. et al. |
| 2017/0256431 | A1 | 9/2017 | Parkhe |
| 2018/0025891 | A1 | 1/2018 | Marakhtanov et al. |
| 2018/0061684 | A1 | 3/2018 | Parkhe |
| 2018/0096869 | A1 | 4/2018 | Yoshida et al. |
| 2018/0112311 | A1 | 4/2018 | Fenwick et al. |
| 2018/0308738 | A1 | 10/2018 | Tobe |
| 2018/0318890 | A1 | 11/2018 | Yasseri et al. |

(56) References Cited

U.S. PATENT DOCUMENTS

| | | |
|---|---|---|
| 2018/0350568 A1 | 12/2018 | Mitsumori et al. |
| 2018/0350649 A1 | 12/2018 | Gomm |
| 2019/0019713 A1 | 1/2019 | Hidaka et al. |
| 2019/0067076 A1 | 2/2019 | Zvokelj |
| 2019/0071778 A1 | 3/2019 | Thomas et al. |
| 2019/0115241 A1 | 4/2019 | Vellore et al. |
| 2019/0136373 A1 | 5/2019 | Yeh et al. |
| 2019/0157052 A1 | 5/2019 | Doan et al. |
| 2019/0218663 A1 | 7/2019 | Funakubo et al. |
| 2019/0221406 A1 | 7/2019 | Funakubo et al. |
| 2019/0237341 A1 | 8/2019 | Yu et al. |
| 2019/0237353 A1 | 8/2019 | Thomas et al. |
| 2019/0267268 A1 | 8/2019 | Abel et al. |
| 2019/0276366 A1 | 9/2019 | Sun et al. |
| 2019/0294050 A1 | 9/2019 | Topping et al. |
| 2019/0341289 A1 | 11/2019 | Parkhe |
| 2019/0355556 A1 | 11/2019 | Takahashi |
| 2020/0013590 A1 | 1/2020 | Liu et al. |
| 2020/0043703 A1 | 2/2020 | French et al. |
| 2020/0340102 A1 | 10/2020 | Kimura et al. |
| 2021/0071300 A1 | 3/2021 | Bajaj et al. |
| 2021/0265138 A1 | 8/2021 | Ikeda et al. |
| 2021/0333715 A1 | 10/2021 | Topping et al. |
| 2021/0340668 A1 | 11/2021 | Macpherson et al. |
| 2022/0044909 A1 | 2/2022 | French et al. |
| 2022/0181127 A1 | 6/2022 | Erickson et al. |
| 2022/0181184 A1 | 6/2022 | Gomm |
| 2022/0415620 A1 | 12/2022 | Thomas et al. |

FOREIGN PATENT DOCUMENTS

| | | | |
|---|---|---|---|
| CN | 105981156 A | 9/2016 | |
| CN | 106148915 A | 11/2016 | |
| CN | 106148916 A | 11/2016 | |
| CN | 106356274 A | 1/2017 | |
| CN | 107665804 A | 2/2018 | |
| CN | 107710378 A | 2/2018 | |
| EP | 2015343 A2 | 1/2009 | |
| JP | H07201496 A | 8/1995 | |
| JP | H08154387 A | 6/1996 | |
| JP | H09176860 A | 7/1997 | |
| JP | H09213778 A | 8/1997 | |
| JP | 2001237051 A | 8/2001 | |
| JP | 2002512448 A | 4/2002 | |
| JP | 2003124296 A | 4/2003 | |
| JP | 2003160874 A | 6/2003 | |
| JP | 2004095722 A | 3/2004 | |
| JP | 2005018992 A | 1/2005 | |
| JP | 2005072286 A | 3/2005 | |
| JP | 2005347620 A | 12/2005 | |
| JP | 2006302887 A | 11/2006 | |
| JP | 4034145 B2 * | 1/2008 | ....... H01L 21/67103 |
| JP | 2008270197 A | 11/2008 | |
| JP | 2009123929 A | 6/2009 | |
| JP | 2009256789 A | 11/2009 | |
| JP | 2010109316 A | 5/2010 | |
| JP | 2011049428 A | 3/2011 | |
| JP | 2011061040 A | 3/2011 | |
| JP | 2014038928 A | 2/2014 | |
| JP | 2014505362 A | 2/2014 | |
| JP | 2014082449 A | 5/2014 | |
| JP | 2016213456 A | 12/2016 | |
| JP | 2016213463 A | 12/2016 | |
| JP | 2017055100 A | 3/2017 | |
| JP | 2017228526 A | 12/2017 | |
| JP | 2018117024 A | 7/2018 | |
| KR | 20050115940 A | 12/2005 | |
| KR | 20060050341 A | 5/2006 | |
| KR | 20080077202 A | 8/2008 | |
| KR | 20090081717 A | 7/2009 | |
| KR | 101333631 B1 | 11/2013 | |
| KR | 20140097312 A | 8/2014 | |
| KR | 101465640 B1 | 11/2014 | |
| KR | 20150099400 A | 8/2015 | |
| KR | 20160000400 A | 1/2016 | |
| KR | 20160127717 A | 11/2016 | |
| KR | 20170042359 A | 4/2017 | |
| KR | 20170054239 A | 5/2017 | |
| KR | 20180000291 A | 1/2018 | |
| KR | 20180011711 A | 2/2018 | |
| TW | 200402095 A | 2/2004 | |
| TW | 201119524 A | 6/2011 | |
| TW | 201525184 A | 7/2015 | |
| TW | 201535453 A | 9/2015 | |
| TW | 201535588 A | 9/2015 | |
| WO | WO-2010087385 A1 | 8/2010 | |
| WO | WO-2011099481 A1 * | 8/2011 | ....... H01L 21/68785 |
| WO | WO-2012087737 A2 | 6/2012 | |
| WO | WO-2013162820 A1 | 10/2013 | |
| WO | WO-2014057771 A1 | 4/2014 | |
| WO | WO-2015105647 A1 | 7/2015 | |

OTHER PUBLICATIONS

English Machine Translation of Maki (JP 4034145 B2) retrieved from Search Jan. 12, 2023 (Year: 2023).*
Schwartz, Mel. (2016). Encyclopedia and Handbook of Materials, Parts, and Finishes (3rd Edition)—Glass-Ceramics Taylor & Francis. Retrieved from https://app.knovel.com/hotlink/pdf/id:kt011YPHQ1/encyclopedia-handbook/ (Year: 2016).*
Merriam-Webster Dictionary definition of "distal" retrieved from Merriam-Webster.com (Year: 2023).*
International Application Serial No. PCT/US2019/015865, International Search Report dated May 17, 2019, 3 pgs.
International Application Serial No. PCT/US2019/015865, Written Opinion dated May 17, 2019, 9 pgs.
International Application Serial No. PCT/US2019/015865, International Preliminary Report on Patentability dated Aug. 13, 2020, 11 pgs.
CN Office Action dated Feb. 28, 2023 in Application No. 201880057283.X with English translation.
European Extended Search Report dated Feb. 8, 2021 issued in Application No. EP 188093256.
Final Office Action dated Apr. 30, 2020 issued in U.S. Appl. No. 15/612,423.
Final Office Action dated Mar. 25, 2021 issued in U.S. Appl. No. 15/612,423.
International Preliminary Report on Patentability dated Dec. 12, 2019 issued in Application No. PCT/US2018/034998.
International Preliminary Report on Patentability dated Mar. 10, 2020 issued in Application No. PCT/US2018/049267.
International Preliminary Report on Patentability dated Oct. 1, 2020 issued in Application No. PCT/US2019/022046.
International Preliminary Report on Patentability dated Feb. 2, 2021, in Application No. PCT/US2019/044113.
International Search Report and Written Opinion dated Jun. 28, 2019 issued in Application No. PCT/US2019/022046.
International Search Report and Written Opinion dated Sep. 6, 2018 issued in Application No. PCT/US2018/034998.
International Search Report and Written Opinion dated Dec. 19, 2019, in Application No. PCT/US2019/044113.
JP Office Action dated Jun. 14, 2022, in Application No. JP2019-566224 With English Translation.
JP Office Action dated Apr. 4, 2023, in Application No. JP2020-541696 with English translation.
JP Office Action dated Oct. 18, 2022, in Application No. JP2019-566224 With English Translation.
Korean Office Action dated Jun. 7, 2021 issued in Application No. KR 10-2021-0056493.
KR Office Action and Search report dated Aug. 30, 2019 in Application No. KR10-2019-0073864 With English Translation.
KR Office Action dated Sep. 28, 2022 in Application No. KR10-2021-7032163 with English translation.
KR Office Action dated Apr. 6, 2022, in Application No. KR1020217032163 with English translation.
KR Office Action dated Apr. 6, 2022, in Application No. KR1020217033272 with English translation.

(56) References Cited

OTHER PUBLICATIONS

KR Office Action dated Apr. 6, 2022, in Application No. KR1020217033273 with English translation.
KR Office Action dated Aug. 2, 2022 in Application No. KR10-2022-0034122 with English translation.
KR Office Action dated Aug. 30, 2019 in Application No. 10-2019-0073864.
KR Office Action dated Dec. 21, 2021, in Application No. KR10-2021-0056493 with English translation.
KR Office Action dated Feb. 3, 2023 in Application No. KR10-2021-7032163 with English translation.
KR Office Action dated Feb. 3, 2023 in Application No. KR10-2021-7033272 with English translation.
KR Office Action dated Feb. 23, 2023 in Application No. KR10-2020-7000026 with English translation.
KR Office Action dated Feb. 27, 2023, in Application No. KR10-2020-7025028 with English translation.
KR Office Action dated Jan. 31, 2023 in Application No. KR10-2021-7033273 with English translation.
KR Office Action dated Mar. 23, 2022, in Application No. KR 10-2019-7037514 with English Translation.
KR Office Action dated May 6, 2022, in Application No. KR1020207000026.
KR Office Action dated Sep. 25, 2022 in Application No. KR10-2020-7000026 with English translation.
KR Office Action dated Sep. 26, 2022 in Application No. KR10-2021-7033273 with English translation.
KR Office Action dated Sep. 27, 2022, in Application No. KR10-2021-7033272 with English translation.
KR Search Report dated Aug. 1, 2019, in Application No. 10-2019-0073864 with English translation.
Notice of Allowance dated Apr. 8, 2021 issued in U.S. Appl. No. 15/926,349.
Notice of Allowance dated Nov. 24, 2021 issued in U.S. Appl. No. 15/612,423.
Office Action dated Jan. 3, 2020 issued in U.S. Appl. No. 15/612,423.
Office Action dated Oct. 16, 2020 issued in U.S. Appl. No. 15/926,349.
Office Action dated Oct. 6, 2020 issued in U.S. Appl. No. 15/612,423.
PCT International Search Report and Written Opinion of the International Searching Authority issued in corresponding International Patent Application No. PCT/US2018/049267 dated Dec. 26, 2018 (Forms PCT/ISA/220, 210, 237) (12 total pages).
SG Office Action dated Mar. 2, 2022, in Application No. SG11201911409S.
Singapore Notice of Eligibility and Examination Report dated Mar. 2, 2022 issued in Application No. SG 11201911409S.
Singapore Search Report and Written Opinion dated Feb. 2, 2021 issued in Application No. SG 11201911409S.
TW Office Action dated Oct. 22, 2021, in application No. TW107118835 with English translation.
TW Office Action dated Sep. 30, 2022 In Application No. TW107130798 with English translation.
U.S. Advisory Action dated Feb. 6, 2023 in U.S. Appl. No. 17/369,694.
U.S. Final Office Action dated Jan. 19, 2022 issued in U.S. Appl. No. 15/696,068.
U.S. Final office Action dated Nov. 21, 2022 in U.S. Appl. No. 17/369,694.
U.S. Final Office Action dated Sep. 14, 2020 issued in U.S. Appl. No. 15/696,068.
U.S. Non-Final office Action dated Jan. 20, 2023 in U.S. Appl. No. 17/652,243.
U.S. Non-Final Office Action dated Jul. 28, 2022, in U.S. Appl. No. 17/369,694 [LAMRP739D1US].
U.S. Non-Final Office Action dated Mar. 7, 2023 in U.S. Appl. No. 17/369,694 [LAMRP739D1US].
U.S. Notice of Allowance dated Jun. 1, 2022 in U.S. Appl. No. 15/696,068 [LAMRP740US].
U.S. Notice of Allowance dated Jul. 23, 2021, issued in U.S. Appl. No. 16/052,877.
U.S. Office Action dated Apr. 28, 2020 dated U.S. Appl. No. 15/696,068.
U.S. Office Action dated Jun. 30, 2021 issued in U.S. Appl. No. 15/696,068.
U.S. Office Action issued on Apr. 15, 2021, issued in U.S. Appl. No. 16/052,877.
U.S. Restriction Requirement dated Jan. 24, 2020 in U.S. Appl. No. 15/696,068.
CN Office Action dated Mar. 18, 2023, in Application No. CN201880036474.8 with English translation.
JP Office Action dated Jun. 13, 2023 in Application No. JP2021-505710 with English translation.
KR Office Action dated Apr. 27, 2023 in Application No. KR10-2020-7030025 with English translation.
KR Office Action dated Jun. 26, 2023 in Application No. KR10-2020-7000026.
TW Office Action dated May 30, 2023, in application No. TW108126884 with English translation.
U.S. Notice of Allowance dated Jul. 11, 2023 in U.S. Appl. No. 17/652,243.
U.S. Notice of Allowance dated Jul. 25, 2023 in U.S. Appl. No. 17/369,694.
CN Office Action dated Oct. 9, 2023, in Application No. CN201980063428.1 with English translation.
KR Office Action dated Jul. 20, 2023, in application No. KR10-2023-0039502 with English translation.
KR Office Action dated Jul. 21, 2023, in Application No. KR10-2022-7040239 with EnglishTranslation.
KR Office Action dated Jun. 26, 2023, in Application No. KR10-2020-7000026 with English translation.
KR Office Action dated May 16, 2023, in Application No. KR10-2023-0039502 with English translation.
KR Office Action dated Sep. 27, 2023, in application No. KR10-2020-7025028 with English translation.
TW Office Action dated Aug. 15, 2023, in application No. TW111140610 with English translation.
TW Office Action dated Aug. 18, 2023, in application No. TW107130798 with English translation.
U.S. Corrected Notice of Allowance dated Sep. 27, 2023, in U.S. Appl. No. 17/369,694.
U.S. Non-Final Office Action dated Sep. 25, 2023, in U.S. Appl. No. 17/823,744.
U.S. Notice of Allowance dated Oct. 17, 2023 in U.S. Appl. No. 17/652,243.
U.S. Appl. No. 18/481,886, inventors Gomm T A, et al., filed Oct. 5, 2023.
U.S. Appl. No. 18/490,265, inventors Topping S, et al., filed Oct. 19, 2023.

* cited by examiner

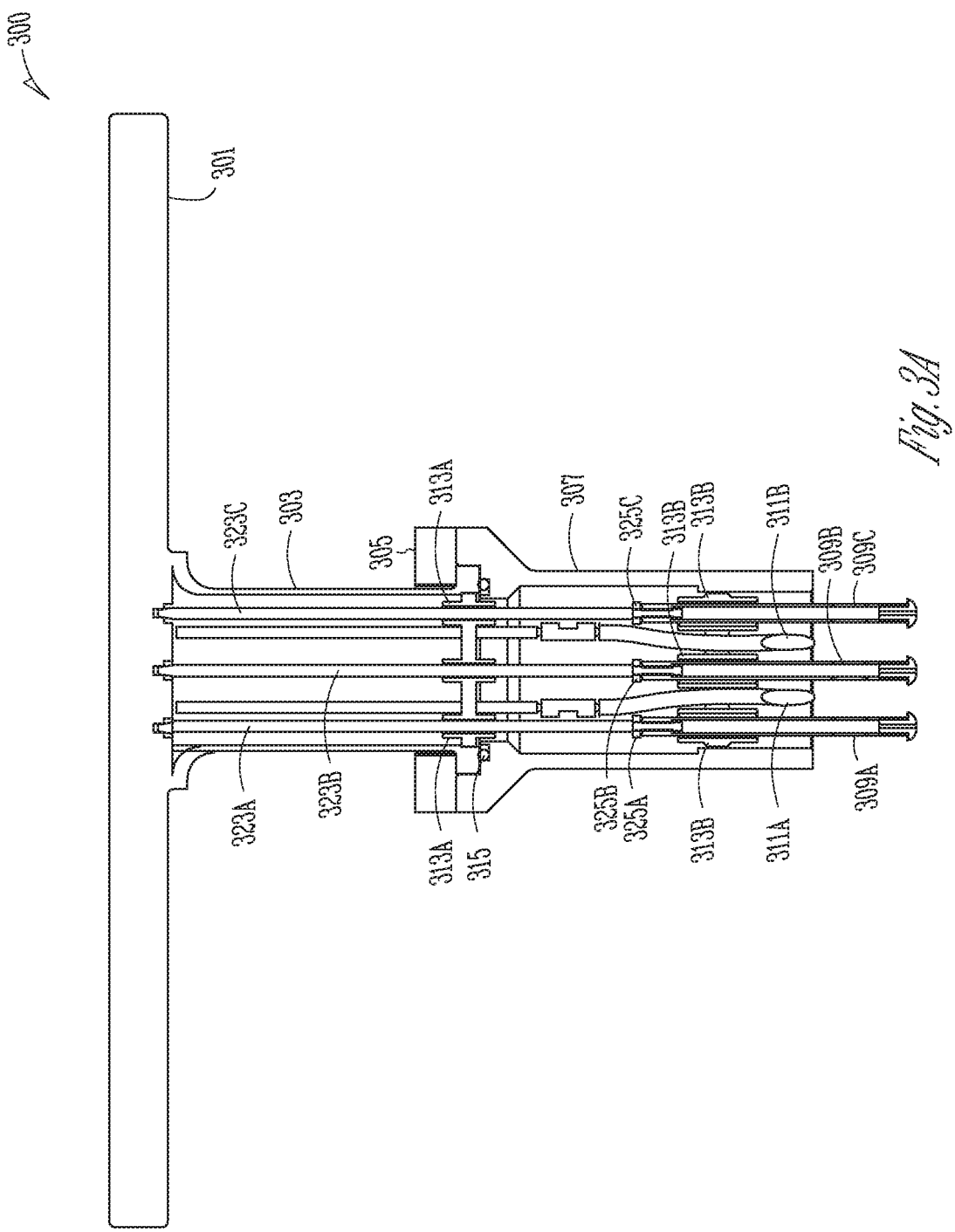

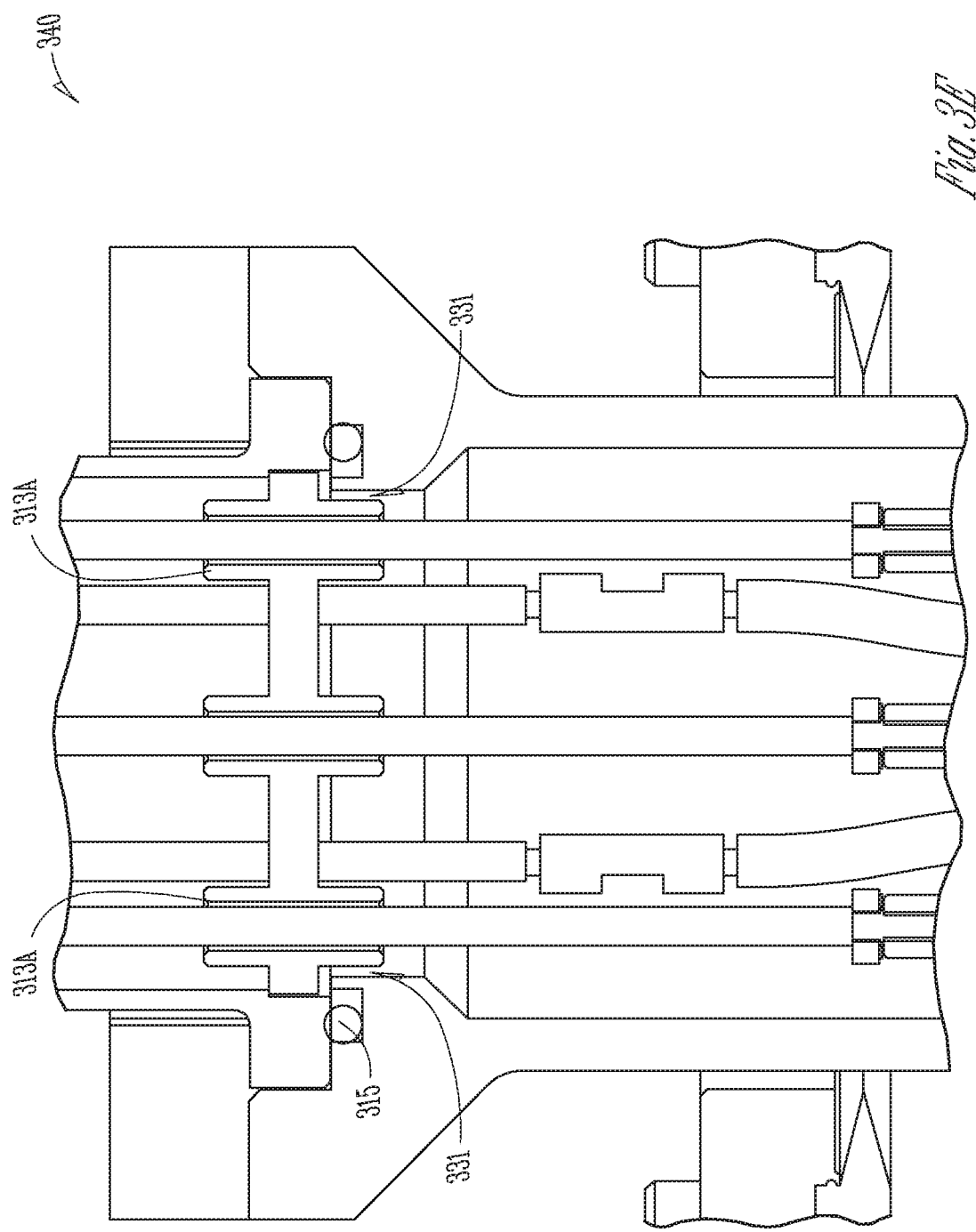

ELECTROSTATIC CHUCK (ESC) PEDESTAL VOLTAGE ISOLATION

CLAIM OF PRIORITY

This application is a U. S. National-Phase Filing under 35 § 371 from International Application No. PCT/US2019/015865, filed on 30 Jan. 2019, and published as WO 2019/152528 A1 on 8 Aug. 2019, which claims the benefit of priority to U. S. Provisional Patent Application Ser. No. 62/624,619, filed on Jan. 31, 2018, and entitled. "Electrostatic Chuck (ESC) Pedestal Voltage isolation," each of which is incorporated by reference herein in its entirety.

TECHNICAL FIELD

The subject matter disclosed herein relates to an electrostatic chuck (ESC) designed to increase a pedestal voltage isolation in a processing tool.

BACKGROUND

In a typical plasma-based processing system, current pedestals used in an ESC rely only on physical separation to isolate RF and AC signals from a ground plane. Any addition of extra electrodes, which carry high voltages, or gas lines (e.g., a nitrogen ($N_2$) gas-purge line) reduce the physical separation distances to below specifications for given radio-frequency (RF), alternating current (AC), and/or direct current (DC) voltages. The reduced physical separation distances can cause arcing and other detrimental effects in the ESC.

The information described in this section is given to provide the skilled artisan a context for the following disclosed subject matter and should not be considered as admitted prior art.

BRIEF DESCRIPTION OF THE FIGURES

FIG. 3A shows a cross-sectional view of an example of an electrostatic chuck (ESC) assembly;

FIG. 3E shows a cross-sectional view of an upper portion of the tube adapter portion of FIG. 3B;

FIG. 3G shows a cross-sectional view of a lower portion of the tube adapter portion of FIG. 3B.

DETAILED DESCRIPTION

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well known process steps or structures have not been described in detail so as not to obscure the disclosed subject matter.

An electrostatic chuck (ESC) that supports and secures various types of substrates (e.g., silicon wafers) used in semiconductor processing operations. A pedestal supporting the ESC, and the ESC in general, are shown and discussed in greater detail with reference to FIG. 3A, below. Low-frequency (LF) radio-frequency (RF) power, high-frequency (HF) RF power, AC power, DC power, and gas purge-lines are all supplied to the substrate through a lower portion of the pedestal. As an increasing number of power and/or gas purge-lines are being required to fit within confined space within the pedestal, there is a concern that the high voltages employed may arc across to grounded surfaces or induce unwanted signals on neighboring power supply lines.

For example, RF power may be transmitted from, for example, at least the ESC in a plasma-based processing system. The plasma-based processing system may include a first heating element disposed at a first portion of the ESC and a second heating element disposed at a second portion of the ESC. The plasma-processing system may further include a power supply, such as an alternating current (AC) power supply, for powering the heating elements. AC circuitry supplies power to the heaters of the ESC through the pedestal. As is understood by the skilled artisan, the ESC heaters provide an important control to maintain a temperature profile of the process which ultimately leads to better uniformity and etch-rates on a substrate.

In a particular example, the ESC pedestal transmits RF, AC, and DC signals to grids that are embedded in a ceramic top plate of the ESC via nickel rods in a stem of the pedestal. These signals pass through a tube adapter portion that serves as an interface between the pedestal and a movable bracket used to raise or lower the substrate while mounted on the ESC. The tube adapter also serves as a ground plane. As disclosed herein, various embodiments of the disclosed subject matter used in the pedestal design use insulative tubes, tube adapters with dielectric-coated interior surfaces, and gaps in various geometries to separate the RF, AC, and DC signals from the ground plane, thereby preventing arcing. The inventive subject matter disclosed herein is described with reference to a plasma-based processing chamber.

Figure 1:
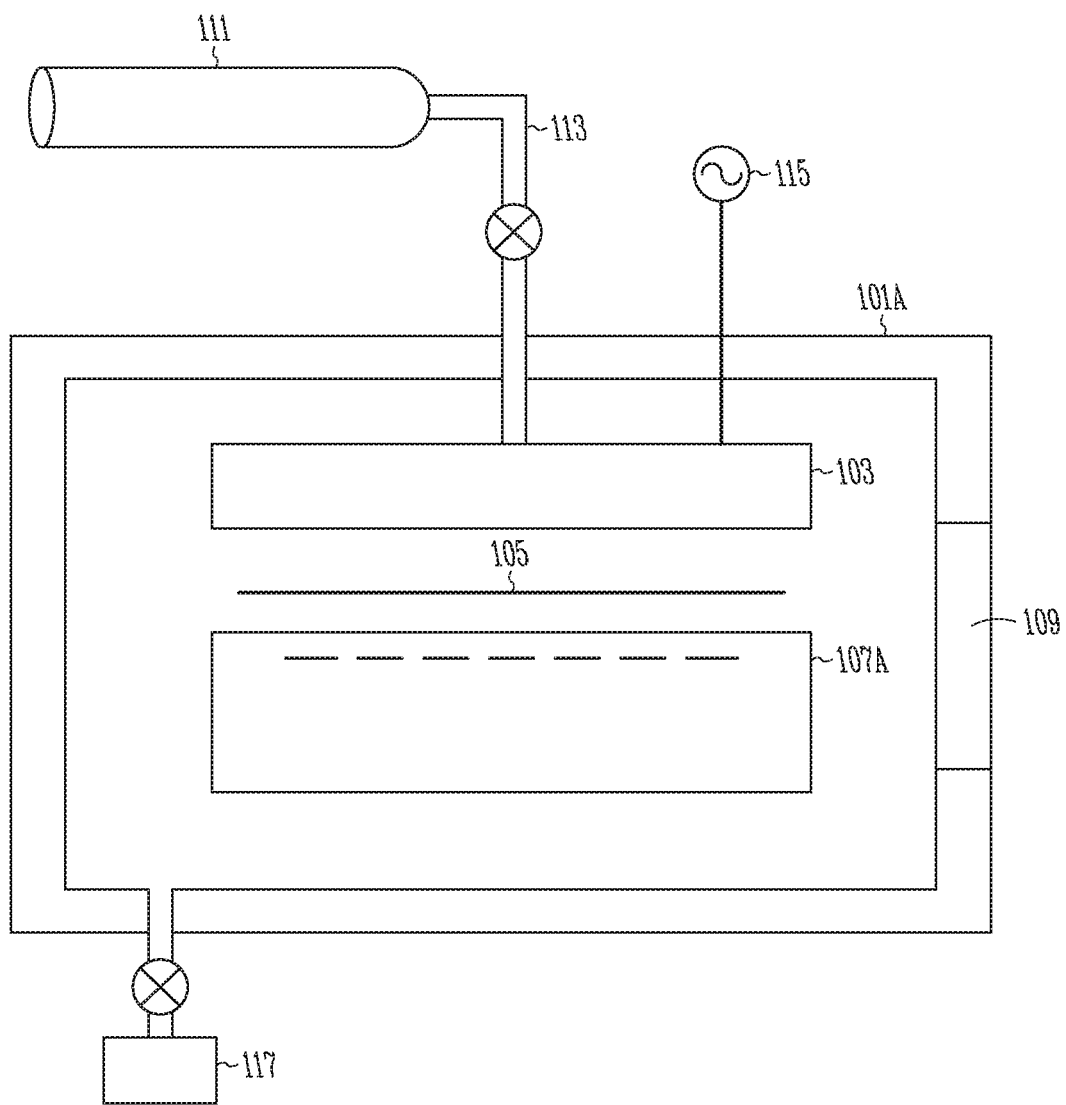
FIG. 1 shows a simplified example of a plasma-based processing chamber, which can include a substrate support assembly comprising an electrostatic chuck (ESC)

With reference now to FIG. 1, a simplified example of a plasma-based processing chamber is shown. FIG. 1 is shown to include the plasma-based processing chamber 101A in which a showerhead electrode 103 and a substrate-support assembly 107A are disposed. Typically, the substrate-support assembly 107A provides a substantially-isothermal surface and may serve as both a heating element and a heat sink for a substrate 105. The substrate-support assembly 107A may comprise an ESC in which heating elements are included to aid in processing the substrate 105, as described above. As understood by a person of ordinary skill in the art, the substrate 105 may a wafer comprising elemental semiconductors (e.g., silicon or germanium), a wafer comprising compound elements (e.g., gallium arsenide (GaAs) or gallium nitride (GaN)), or variety of other substrate types known in the art (including conductive, semiconductive, and non-conductive substrates).

In operation, the substrate 105 is loaded through a loading port 109 onto the substrate-support assembly 107A. A gas line 113 supplies one or more process gases to the showerhead electrode 103. In turn, the showerhead electrode 103 delivers the one or more process gases into the plasma-based processing chamber 101A. A gas source 111 to supply the one or more process gases is coupled to the gas line 113. An RF power source 115 is coupled to the showerhead electrode 103.

In operation, the plasma-based processing chamber 101A is evacuated by a vacuum pump 117. RF power is capacitively coupled between the showerhead electrode 103 and a lower electrode (not shown explicitly) contained within or on the substrate-support assembly 107A. The substrate-support assembly 107A is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. However, upon reading and understanding the disclosure provided herein, the person of ordinary skill in the art will recognize that a coil required to block or partially block a particular RF frequency can be designed as needed. Therefore, particular frequencies discussed herein are provided merely for ease in understanding. The RF power is used to energize the one or more process gases into a plasma in the space between the substrate 105 and the showerhead electrode 103. As is known in the relevant art, the plasma can assist in depositing various layers (not shown) on the substrate 105. In other applications, the plasma can be used to etch device features into the various layers on the substrate 105. As noted above, the substrate-support assembly 107A may have heaters (not shown) incorporated therein. The person of ordinary skill in the art will recognize that, while the detailed design of the plasma-based processing chamber 101A may vary, RF power is coupled through at least the substrate-support assembly 107A.

Figure 2:
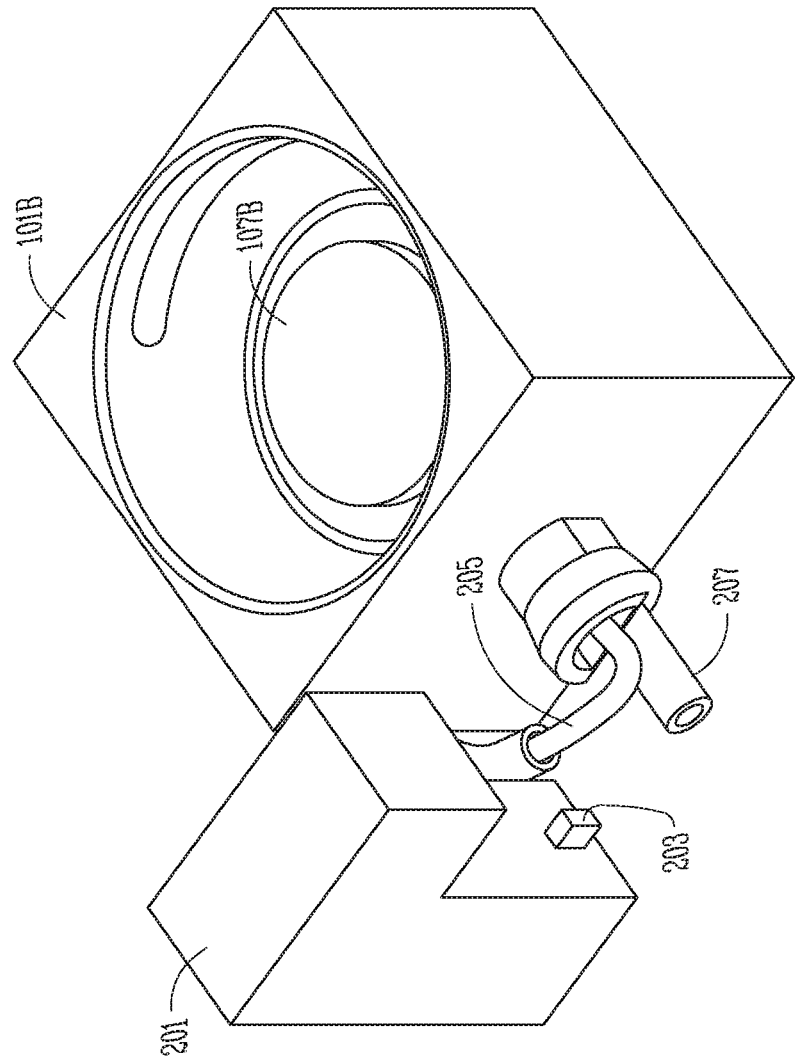
FIG. 2 shows an example of a three-dimensional (3D) representation illustrating several components of the plasma-based processing system of FIG. 1.

Referring now to FIG. 2, a three-dimensional (3D) representation illustrating several components of the plasma-based processing system of FIG. 1 is shown. A chamber portion 101B of the plasma-based processing chamber 101A of FIG. 1 is shown to include an RF filter enclosure 201, an alternating current (AC) connector 203, a power cable 205, and an RF power feed cable 207. An uppermost portion 107B of the substrate-support assembly 107A of FIG. 1 is also shown. As noted above, the substrate-support assembly 107A may be an ESC.

In various embodiments, the ESC may be a tunable ESC (TESC) capable of a tunable temperature control in two-zones on the uppermost portion 107B of the substrate-support assembly 107A. The temperature-tuning capability of the ESC may be achieved by implementing two electric heating elements (shown as dashed lines in the substrate-support assembly 107A of FIG. 1) embedded under an uppermost portion of the ESC, proximate to the substrate 105. In the case of a two-zone TESC, one electric heating element is implemented for each of the two zones.

The electric heating elements may be powered by alternating current (AC) supplied by an AC power supply (not shown in the figures) through the AC connector 203 through the RF filter enclosure 201 and the power able 205. The RF filter enclosure 201 also contains an RF filter (not shown but known in the art) to prevent or reduce RF power from being delivered to the electric heating elements. The temperature of each of the electric heating elements may be controlled by techniques well-known in the art.

With concurrent reference to FIGS. 1 and 2, during operation of the plasma-based processing chamber 101A, RF power is supplied to the substrate-support assembly 107A (ESC) through the RF power feed cable 207 (not shown in FIG. 1), as well as to the showerhead electrode 103, from the RF power source 115. The ESC therefore serves as a lower electrode. Equipotential field lines are set up over the substrate 105 between the substrate 105 and the showerhead electrode 103. During plasma processing, positive ions accelerate across the equipotential field lines to impinge on the surface of the substrate 105, thereby providing the desired etch effect, such as improving etch directionality (the person ordinary skill in the art will recognize any appropriate modifications needed for film deposition as opposed to etch).

Referring now to FIG. 3A, a cross-sectional view of an example of an electrostatic chuck (ESC) assembly 300 is shown. The ESC assembly 300 includes a top plate 301, which supports the substrate 105 as described above, a pedestal 303, and a tube adapter 307. The pedestal 303 and the tube adapter 307 are generally secured together by a bolted flange 305. An O-ring 315, or other type of mechanical gasket or sealing device known in the art, prevents atmospheric pressure (internal to the ESC assembly 300) from being pulled down in pressure by a vacuum environment (external to the ESC assembly 300).

The tube portion may be formed from a number of materials known to the skilled artisan, such as various types of metals (e.g., aluminum (Al) and stainless steel (e.g., a 316L alloy) or non-metals capable of withstanding the relatively high temperatures encountered within a plasma-based processing system (e.g., the temperature may be approximately 250° C.). In a specific exemplary embodiment, the tube portion is formed from aluminum with an insulating coating on an inner portion (as shown and described with regard to FIG. 3B, below).

Within the tube adapter 307, three insulative tubes, 309A, 309B, 309C, are shown through which, for example, RF signal electrodes travel to the top plate 301. The person of ordinary skill in the art will recognize that, based on a particular implementation of an ESC assembly, a larger or smaller number of insulative tubes may be used.

The insulative tubes 309A, 309B, 309C may be comprised of a number of insulating materials known in the relevant art, such as various types of polymers, provided that the material is chosen to maintain structural integrity in the relatively high temperatures encountered within a plasma-based processing system (e.g., the temperature may be approximately 250° C.). Further, the dielectric material should be chosen to have a dielectric strength that remains substantially consistent over time in the presence of the elevated temperatures and the voltages (described with regard to Table I, below). In a specific exemplary embodiment, the insulative tubes 309A, 309B, 309C are comprised of polyimide (such as Kapton®, a polymer of imide monomers). Kapton® is available from E. I. du Pont de Nemours and Company, 1007 Market Street, Wilmington, Delaware, USA.

The insulative tubes 309A, 309B, 309C are separated and held in place by lower separator sleeves 313B. These sleeves may be formed from a number of dielectric materials, such as various types of non-conducting ceramics. For example, in a specific exemplary embodiment, the lower separator sleeves 313B are formed from Macor®. Macor® is a machinable glass-ceramic available from Corning Incorporated, One Riverfront Plaza, Corning New York, USA.

In a specific exemplary embodiment, the lower separator sleeves 313B are sized such that they are loose enough such that the insulative tubes 309A, 309B, 309C may be readily removed or inserted during routine maintenance or repair operations of the ESC assembly 300.

The tube adapter 307 also is shown to include AC heater wires 311A, 311B and thermal chokes 325A, 325B, 325C. The ESC assembly is also shown to include a number of conductive rods 323A, 323B, 323C configured to carry, for example, high voltage signals.

In a specific exemplary embodiment, the thermal chokes 325A, 325B, 325C may comprise, for example, gold-plated Inconel (an austenitic, nickel-chromium-based alloy). Components comprising Inconel retain their shape and strength over a wide range of temperatures, whereas other metallic-based components, such as aluminum and steel, may creep or otherwise deform at increased temperatures.

Also, in various embodiments, the number of conductive rods 323A, 323B, 323C may comprise, for example, nickel. The number of conductive rods 323A, 323B, 323C are supported by rod supports 313A, which form a portion of the pedestal 303 that is internal to the stem. In various embodiments, the rod supports 313A may comprise, for example, alumina ($Al_2O_3$).

The tube adapter 307 also includes at least one gas-purge line (not shown as it is obscured by a center one of the insulative tubes 309B). The tube adapter 307 may also contain other power supply lines. The gas-purge lines may be, for example, brass or stainless steel. However, these materials can be the same as what is currently used on a contemporaneous ESC device and therefore do not need to be modified or changed in light of the disclosed subject matter. Brass is a non-ferrous material so nearby RF signals will have no effect on the purge-gas line. The at least one gas-purge line may carry a variety of gases such as nitrogen ($N_2$) or argon (Ar) as noted above.

Overall, an example of various voltages that may be encountered within the ESC assembly are noted below in Table I.

TABLE 1

| Voltage Type | RMS Voltage | Peak Voltage |
| --- | --- | --- |
| $HF_{max}$ | 500 V | 707 V |
| $LF_{max}$ | 800 V | 1131 V |
| ESC Clamping Voltage$_{max}$ | 1000 VDC | NA |

By combining the various voltages shown in Table I. one can arrive at a total working voltage on the ESC as:

$ESC_{working\ voltage}$=707 V+1131 V+1000 V $ESC_{working\ voltage}$=2838 V

Therefore, to prevent arcing within the ESC assembly, a clearance specification may be determined by a skilled artisan based on, for example, air at a given relative humidity. In an example based on the example voltages supplied by Table I, a clearance specification to prevent arcing is about 394 V/mm (e.g., approximately 10 Volts/mil, where one mil=0.001 inches), mixed frequency. Therefore, by knowing the clearance specification, a skilled artisan may also calculate an air gap (shown and described with regard to FIG. 3F, below) as:

2838 V/(394 V/mm)=7.2 mm (about 284 mils or 0.284 inches)

Further, by knowing the dielectric strength of various materials, the skilled artisan can determine a minimum thickness required for a material. For example, polyimide has a dielectric strength of about 118 V/mm (approximately 3000 V/mil). In comparison, a hard-anodized coating on aluminum is about 25 V/mm (approximately 640 V/mil). By knowing each of the working voltage and the dielectric strength for a given material or coating, the skilled artisan can determine a minimum thickness for a particular application.

The skilled artisan will recognize that actual voltages encountered within an ESC assembly may vary depending on a given design requirements. Therefore, Table I should be considered to provide examples of voltages encountered simply to provide a better understanding of the disclosed subject matter in light of the various embodiments described herein.

As is also known to the skilled artisan, all thin coated or anodized layers should have broken (e.g., rounded) radii at sharp corners and edges to prevent a very thin or non-covered portion of the underlying material (e.g., various edges and corners of the tube adapter 307) from occurring. Also, the thin coated and anodized layers should be formed so as to prevent or reduce cracks through which arcing could occur.

Figure 3B:
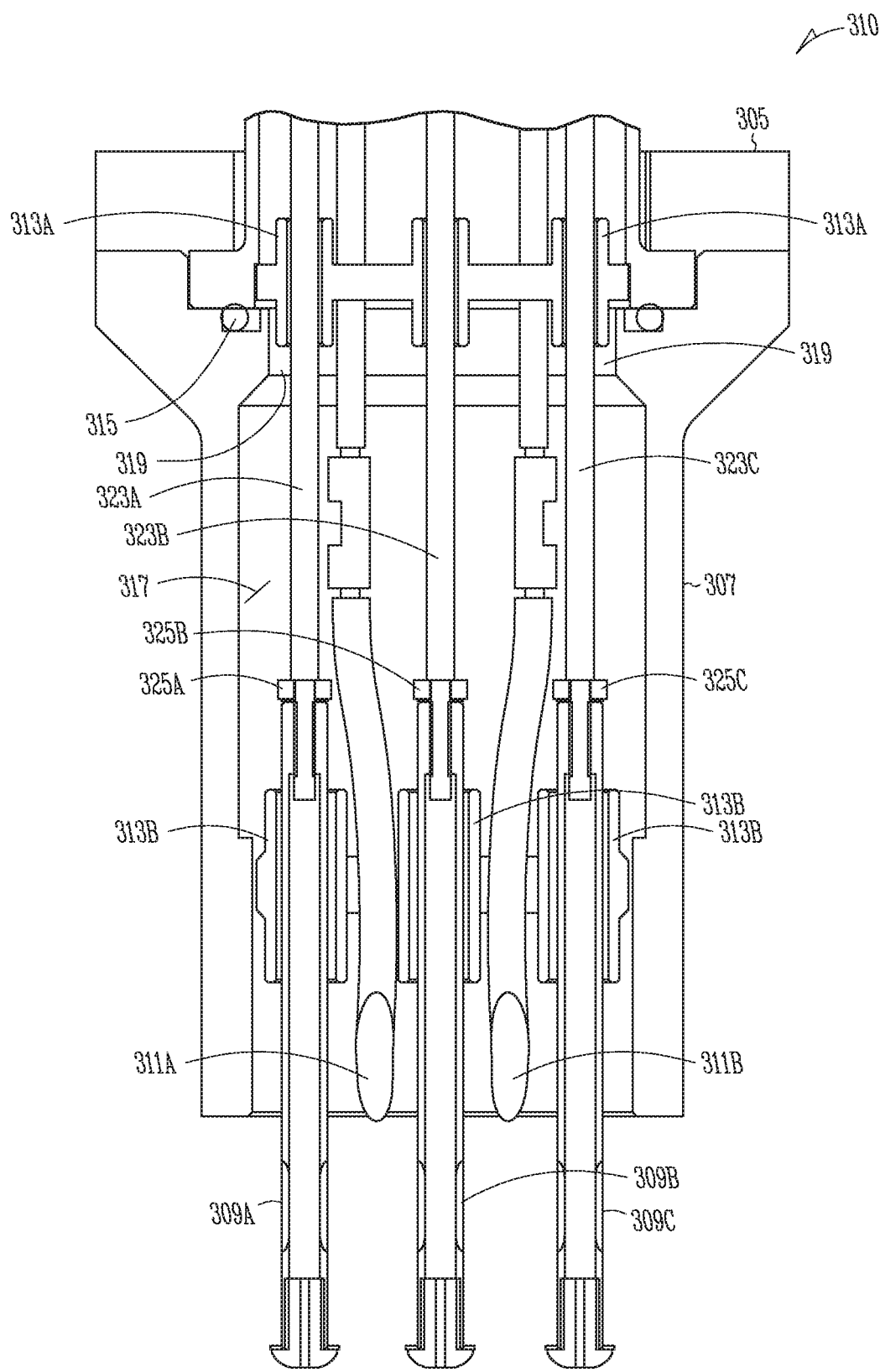
FIG. 3B shows a cross-sectional view of an example of a tube adapter portion of the ESC assembly of FIG. 3A.

Referring now to FIG. 3B, a cross-sectional view of an example of a tube adapter portion 310 of the ESC assembly of FIG. 3A is shown. As described above with reference to FIG. 3A, a dielectric coating 317 may be deposited or otherwise formed on an interior portion of the tube adapter 307. As noted above, the dielectric coating may comprise, for example, a hard-anodization coating or a polyimide coating. A skilled artisan may also consider the coefficient-of-thermal-expansion (CTE) differences between the tube adapter 307 and the dielectric coating 317 to make a determination whether any flaking or particle shedding may occur as the tube adapter 307 undergoes changes in thermal environment. For example, the CTE for the dielectric coating and the CTE for the material from which the tube adapter 307 is formed can be chosen to be substantially similar. The CTE number and related calculations are known in the art.

In various embodiments, an enlarged gap portion 319 may be formed proximate to outboard ones of the conductive rods 323A, 323B, 323C to eliminate arcing by forming, for example, an enlarged air gap. The determination of a clearance specification for a size of the enlarged gap portion 319 is discussed above with reference to FIG. 3A and depends partially on the dielectric-breakdown strength of a material chosen (e.g., air) that is within the enlarged gap portion 319.

Since the O-ring 315 is being forced outward, due to a higher pressure within the tube adapter 307 an outside the tube adapter 307 (at some level of vacuum during a processing operation), the O-ring 315 is pushed against peripheral (outer) walls of the tube adapter 307 and away from the enlarged gap portion 319. Therefore, an increase in the size of the enlarged gap portion 319 does not lessen the integrity of the seal provided by the O-ring 315.

Figure 3C:
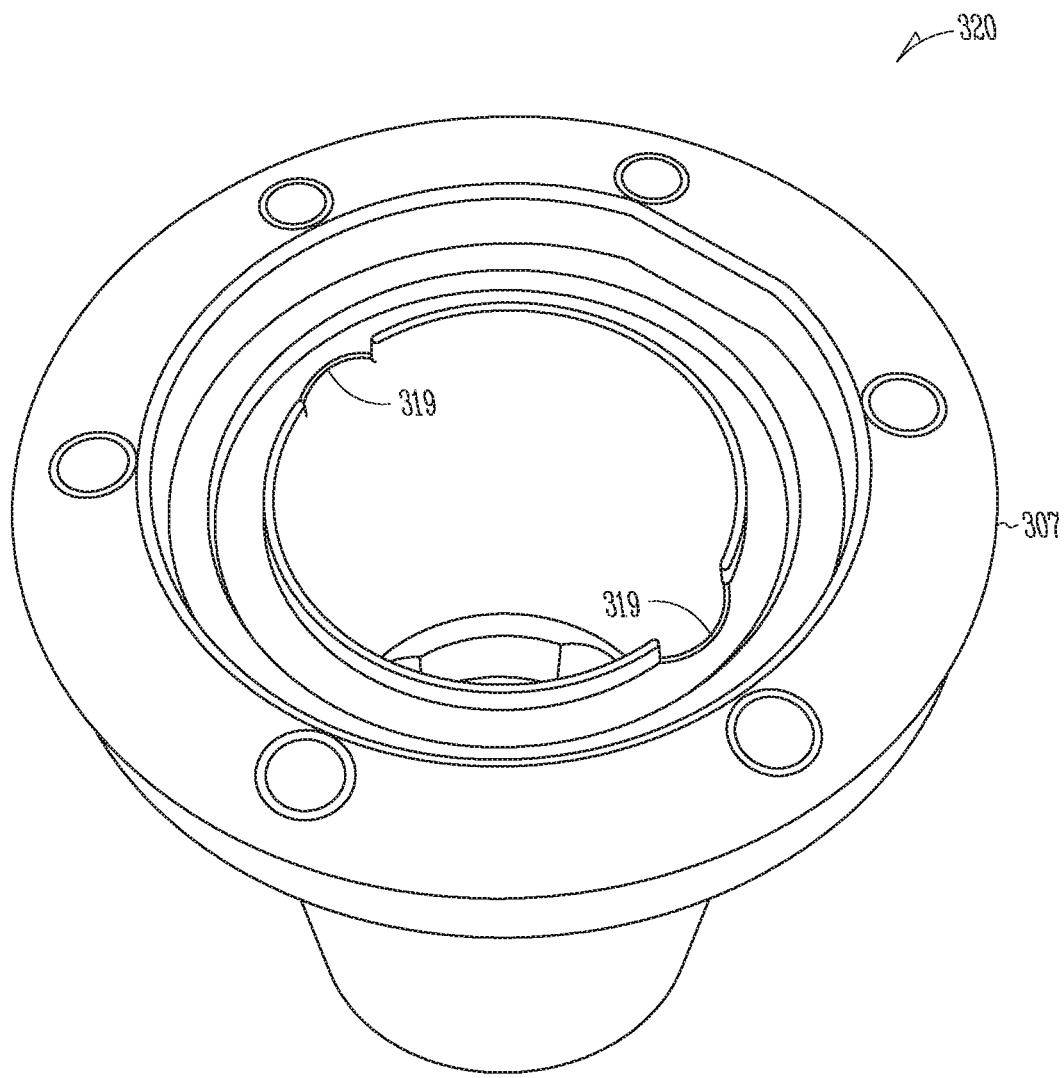
FIG. 3C shows a three-dimensional (3D) representation of a top portion of the tube adapter portion of FIG. 3B.

FIG. 3C shows a three-dimensional (3D) representation of a top portion 320 of the tube adapter portion of FIG. 3B, A cutout portion of the tube adapter 307 shows a dimension of the enlarged gap portion 319 that is increased from a standard diameter within the tube adapter 307. As noted above, the enlarged gap portion 319 is formed proximate to outboard ones of the conductive rods 323A, 323B, 323C to reduce or eliminate (e.g., limit) arcing. Although not explicitly shown, the enlarged gap portion 319 may be supplemented by, or replaced by, insertion of another material having a higher dielectric-breakdown strength than air. Such materials are described herein and are otherwise known in the art.

Figure 3D:
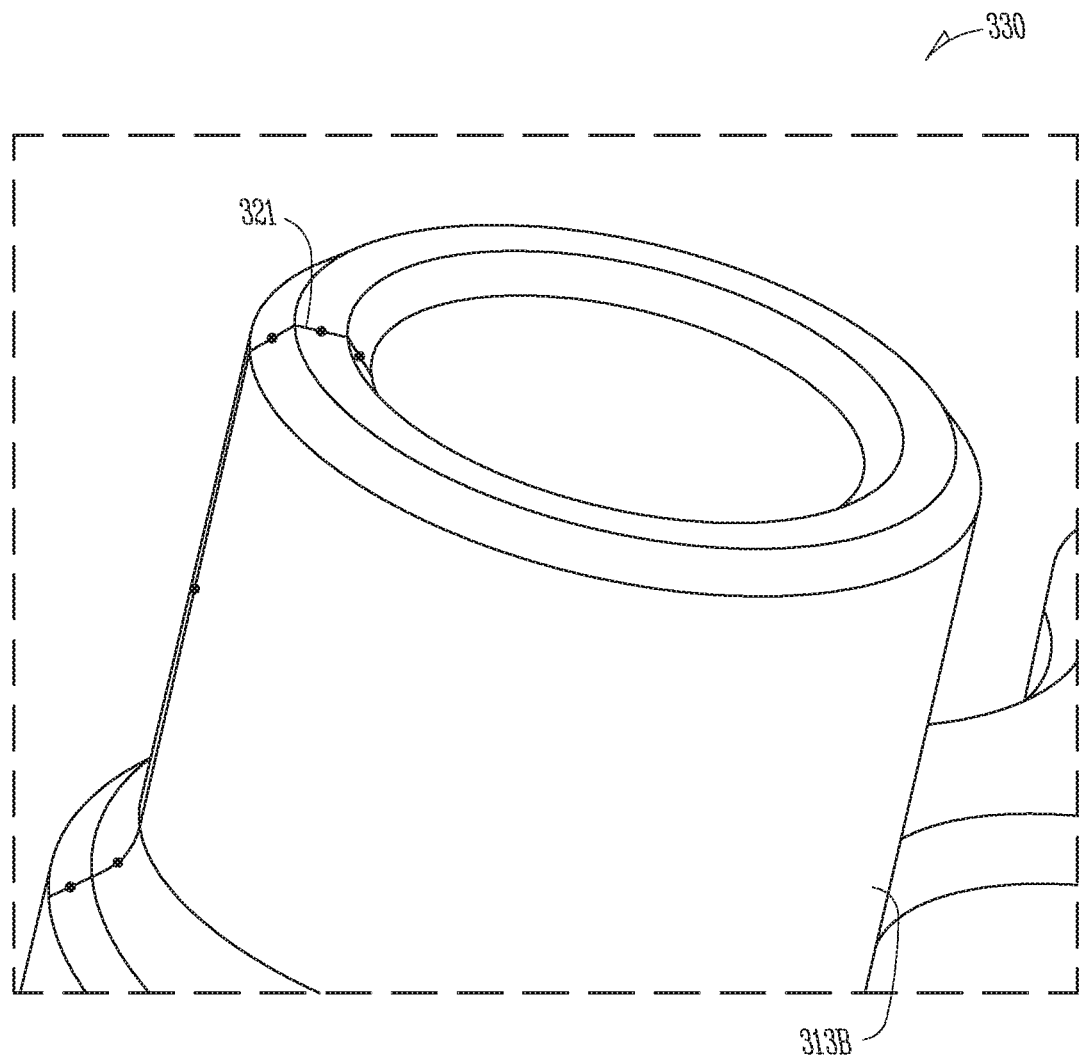
FIG. 3D shows a 3D representation of an upper portion of a separator sleeve of the tube adapter portion of FIG. 3B.

FIG. 3D shows a 3D representation of an upper portion 330 of one of the lower separator sleeves 313B of the tube adapter 307 portion of FIG. 3B. A determination of an increase in creepage distance, due to the CTE, when the lower separator sleeve 313B experiences an increase in heat due to the processing environment as discussed above. The increase in creepage distance is indicated by a line 321. The line 321 indicates a creepage distance between the thermal chokes 325A, 325B, 325C and an inner wall of the tube adapter 307 (see, e.g., FIG. 3B). The determination of the increase in creepage distance provides a check on whether a clearance specification is maintained, even when components are heated. Such calculations for a determination of the increase in creepage distance for a given CTE, or CTEs for different materials, are known in the relevant art.

With reference now to FIG. 3E, a cross-sectional view 340 of an upper portion of the tube adapter portion near a sealing O-ring 315 of FIG. 3B, is shown. The cross-sectional view 340 shows an air gap 331 formed by the enlarged gap portion 319 (see FIG. 3C). In this embodiment, the air gap 331 relies on air as a dielectric (insulator) material. However, the person of ordinary skill in the art will recognize that other dielectric materials may be used. For example, and as described above, an anodized layer formed on inner surfaces of the tube adapter 307 provides a dielectric layer for the dielectric coating 317 (see FIG. 3B). In addition to or in other embodiments, a polyimide or other insulative material may be formed on the inner surfaces of the tube adapter 307. In addition to or in other embodiments, a size of the air gap 331 is increased so as to reduce or eliminate any potential arcing between any of the voltage carrying electrodes (e.g., such as the electrodes contained within outboard ones of the conductive rods 323A, 323B, 323C) and portions of the tube adapter 307 proximate the electrodes and the rod supports 313A.

Figure 3F:
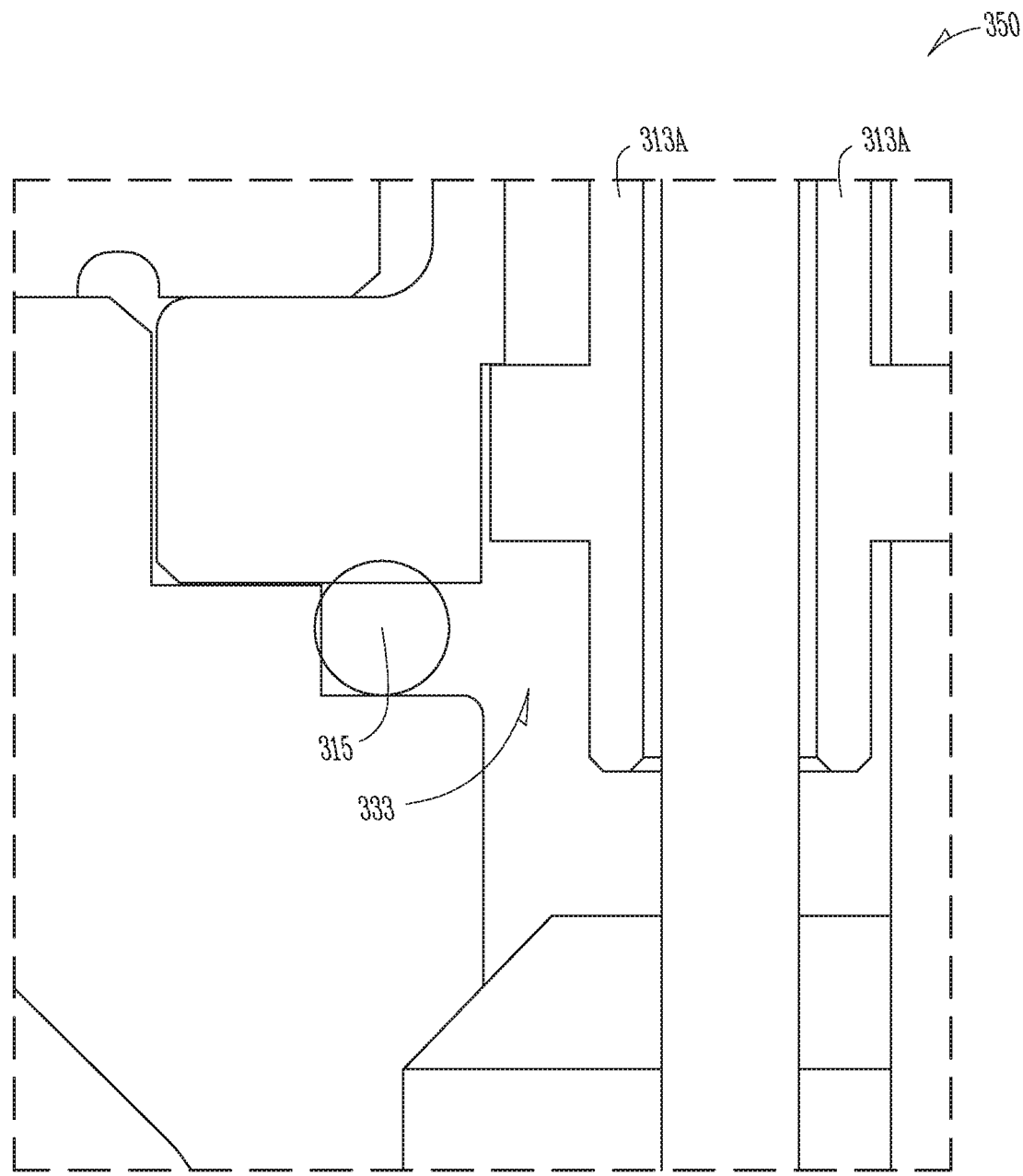
FIG. 3F shows a cross-sectional view of an upper portion of the tube adapter portion near a sealing O-ring of FIG. 3B.
Figure 3C:
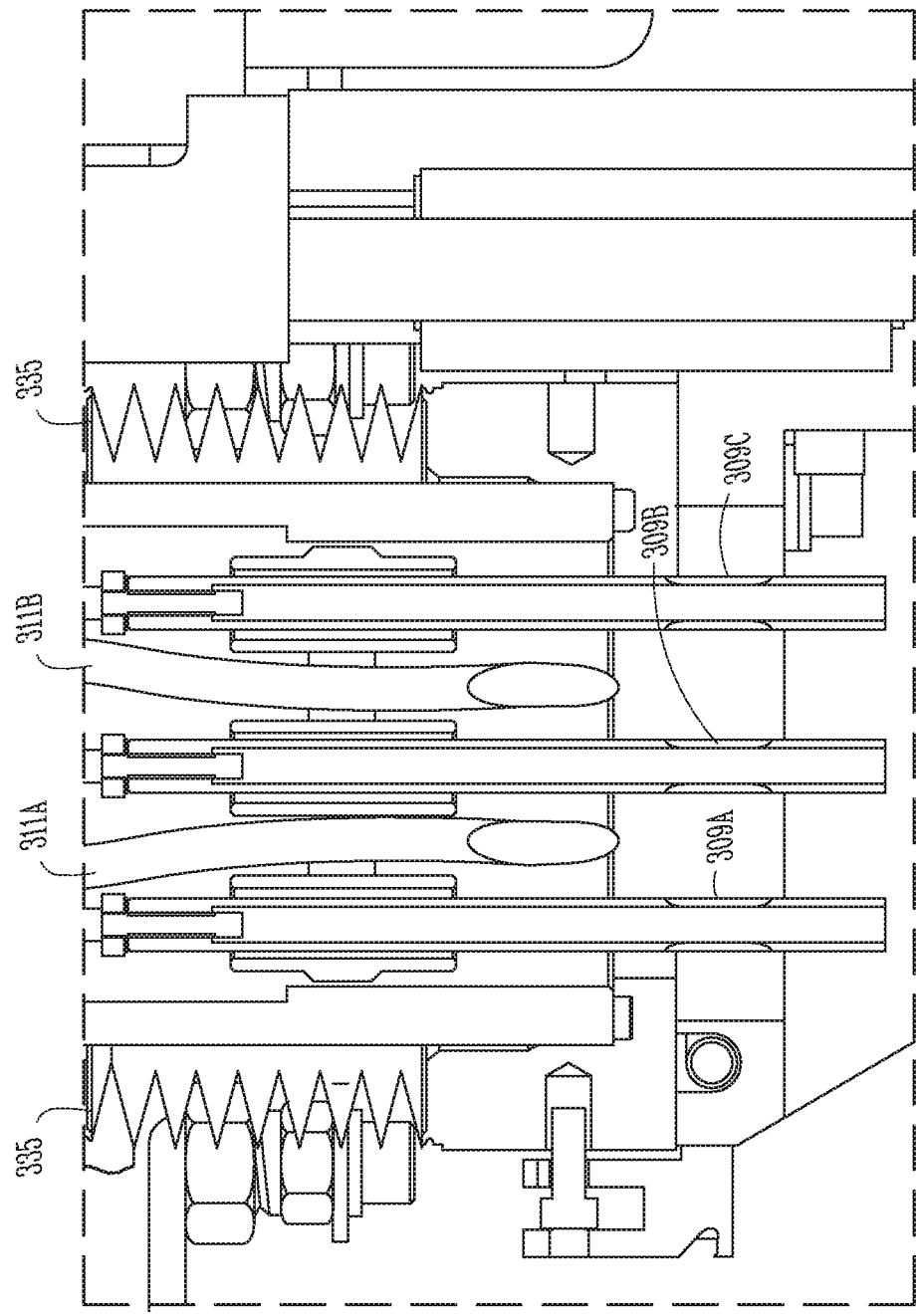

FIG. 3F shows a cross-sectional view 350 of a central portion of the tube adapter portion of FIG. 3B. As noted above with reference to FIG. 3B, the O-ring 315 is being forced outward, due to a higher pressure within the tube adapter 307 than outside the tube adapter 307 (at some level of vacuum during a processing operation). Consequently, the O-ring 315 is pushed against peripheral (outer) walls of the tube adapter 307 and away from the enlarged gap portion 319 and away from the space 333 between the rod supports 313A, and the O-ring 315. Therefore, an increase in the size of the enlarged gap portion 319 does not lessen the integrity of the seal provided by the O-ring 315 between the atmospheric and vacuum portions of the processing system.

FIG. 3G shows a cross-sectional view 360 of a lower portion of the tube adapter portion of FIG. 3B, A bellows 335 maintains a pressure differential between an inner portion of the ESC assembly 300, at substantially atmospheric pressure, and an external portion of the ESC assembly 300, at some level of vacuum during processing operations. The cross-sectional view 360 is provided so as to more readily identify, to a skilled artisan, locations of the insulative tubes 309A, 309B, 309C, and the AC heater wires 311A, 311B, Further, the cross-sectional view 360 serves to illustrate that since all changes are made on an interior volume of the ESC assembly 300 (FIG. 3A), especially within the tube adapter 307 (see, e.g., FIG. 3B), the various embodiments disclosed herein may readily be retrofit into an existing plasma-based processing or other substrate-processing system since all external dimensions and connections from the ESC assembly 300 are maintained. Therefore, no modifications to an existing processing system need to occur.

As noted herein, the air gap 331 and the insulative tubes 309A, 309B, 309C insulates the high voltage lines within and proximate to the insulative tubes 309A, 309B, 309C from grounded portions (e.g., grounded portions of the tube adapter 307). Therefore, the insulative tubes 309A, 309B, 309C generally extend down to a point at which arcing between the HV lines and the grounded surfaces (e.g., distal to a lower portion of the tube adapter 307) can no longer occur. This point can be determined based on the calculations provided above with reference to FIG. 3A.

Figure 4:
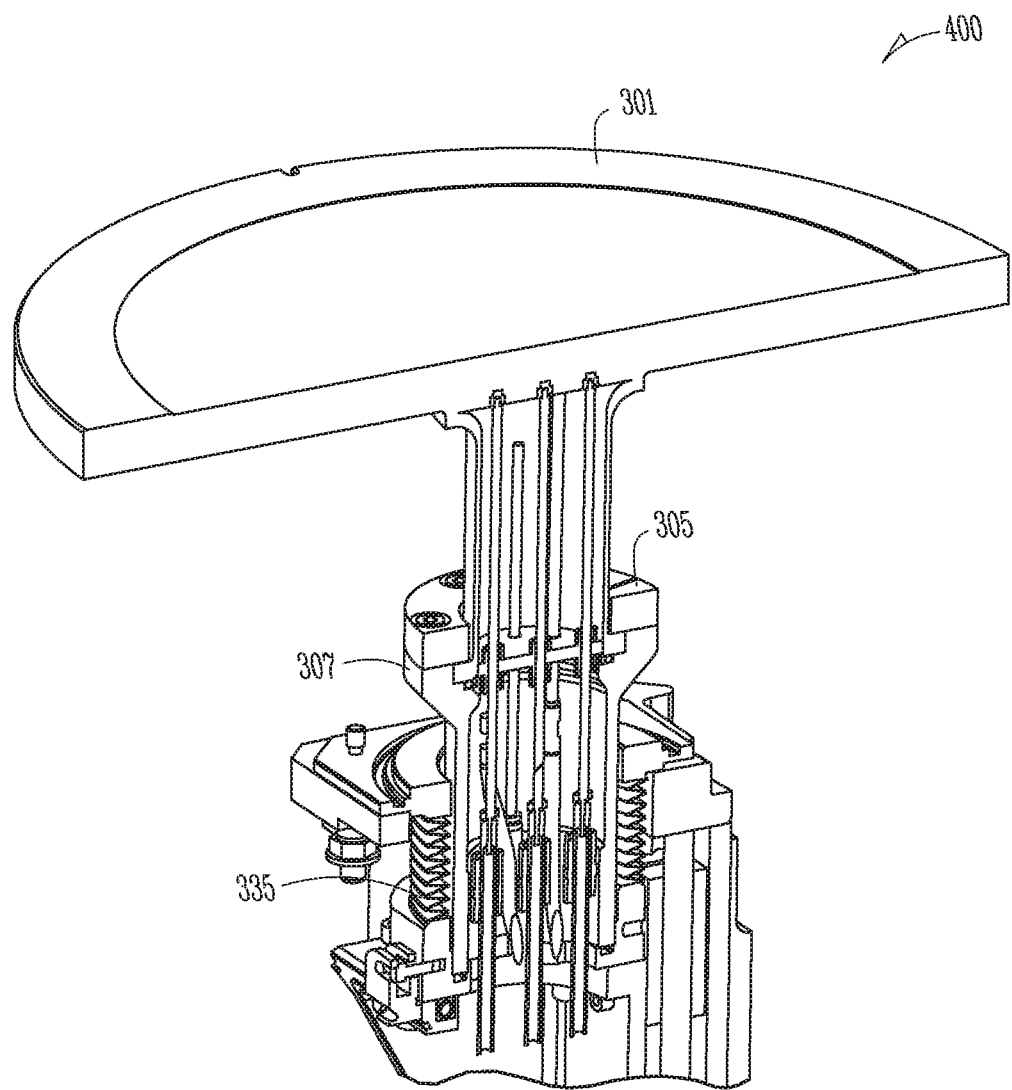
FIG. 4 shows a 3D cross-sectional view of ESC assembly of FIG. 3A.

FIG. 4 shows a 3D cross-sectional view of the ESC assembly of FIG. 3A. The bellows 335 allows the ESC assembly 300 (see FIG. 3A) to be movable, thereby moving a mounted substrate 105 (see FIG. 1) relative to a movable bracket portion located below the bellows 335.

Overall, as shown and described herein, the disclosed subject matter incorporated into the ESC assembly 300 of FIG. 3A may use a variety of embodiments described by the disclosed subject matter to isolate high-voltage electrical signals from the ground plane.

In specific exemplary embodiments as show described herein, one HV isolation technique uses polyimide tubes (e.g., the insulative tubes 309A, 309B, 309C) to enclose RF signal electrodes allowing isolation of these signals before the connection to their respective insulation wires. The use of polyimide is appropriate for this application as it is a very good insulator and can resist the high temperatures in this location. Another Another exemplary embodiment uses a HV isolation technique employing a hard-anodized surface or polyimide coating treatment on the inner surface of the tube adapter 307. The surface treatment (e.g., the dielectric coating 317 of FIG. 3B) provides an overall resistance and separation between the HV electrodes and the ground plane (e.g., the tube adapter 307).

Another exemplary embodiment uses a HV isolation technique employing one or more cut outs in the upper tube adapter geometry (e.g., the enlarged gap portions 319 of FIG. 3C), which provides further isolation between the HV electrodes (e.g., within outboard ones of the insulative tubes 309A, 309B, 309C) and the ground plane (e.g., the tube adapter 307).

Moreover, since all changes are made on an interior volume of the ESC assembly 300 (see FIG. 3A), especially within the tube adapter 307, the various embodiments disclosed herein may readily be retrofit into an existing plasma-based processing or other substrate-processing system since all external dimensions and connections from the ESC assembly 300 are maintained. Therefore, no modifications to an existing processing system need to occur.

Therefore, the description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other ESC embodiments discussed herein.

Consequently, many modifications and variations can be made, as will be apparent to the person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A tube adapter portion for use in an electrostatic chuck (ESC) assembly of a plasma-based processing system, the tube adapter portion comprising aluminum metal comprising:
    a dielectric coating formed on an inner surface of the tube adapter portion configured to prevent arcing between high voltage electrodes within the tube adapter portion and a main body of the tube adapter portion during an operation of the plasma-based processing system, the dielectric coating having a coefficient-of-thermal-expansion (CTE) that is substantially similar to a material from which the tube adapter portion is formed,
    a plurality of insulative tubes within the tube adapter portion, each of the plurality of insulative tubes configured to receive one of multiple radio-frequency (RF) signal electrodes to be enclosed therein, each of the plurality of insulative tubes being configured to prevent arcing between a respective one of the radio-frequency (RF) signal electrodes enclosed therein and a main body of the tube adapter portion during operation of the plasma-based processing system, and
    an enlarged gap portion of the tube adapter portion above the plurality of insulative tubes, a dimension of the enlarged gap portion being configured to prevent arcing between a high voltage signal carried by respective ones of the radio-frequency signal electrodes and a main body of the tube adapter portion during operation of the plasma-based processing system.

2. The tube adapter portion of claim 1, wherein the CTE for the dielectric coating is selected to prevent particle shedding due to changes in a thermal environment in which the tube adapter operates.

3. The tube adapter portion of claim 1, wherein the dielectric coating is a hard-anodization coating.

4. The tube adapter portion of claim 1, wherein the dielectric coating is a polyimide coating.

5. The tube adapter portion of claim 1, wherein the ESC assembly further comprises a pedestal that is mechanically-coupled to the tube adapter portion.

6. The tube adapter portion of claim 5, wherein the tube adapter portion is configured to be retrofit with the pedestal of an existing plasma-based processing system.

7. A tube adapter portion for use in an electrostatic chuck (ESC) assembly of a plasma-based processing system, the tube adapter portion comprising:
    a plurality of insulative tubes within the tube adapter portion, each of the plurality of insulative tubes configured to receive one of multiple conductive rods to be enclosed therein, each of the plurality of insulative tubes being configured to prevent arcing between the respective one of the conductive rods enclosed therein and a main body of the tube adapter portion during operation of the plasma-based processing system, each of the plurality of insulative tubes being configured to extend below the tube adapter portion, and
    an enlarged gap portion of the tube adapter portion above the plurality of insulative tubes, a dimension of the enlarged gap portion being configured to prevent arcing between a high voltage signal carried by respective ones of the conductive rods and a main body of the tube adapter portion during operation of the plasma-based processing system.

8. The tube adapter portion of claim 7, wherein the multiple conductive rods comprise radio-frequency (RF) signal electrodes.

9. The tube adapter portion of claim 7, wherein the plurality of insulative tubes have a dielectric strength that is substantially consistent in time in the presence of elevated temperatures encountered during an operation of the plasma-based processing system.

10. The tube adapter portion of claim 7, further comprising:
    a thermal choke coupled on a first side to each of the plurality of insulative tubes; and
    a conductive rod coupled to a second side to each of the thermal chokes.

11. The tube adapter portion of claim 7, wherein each of the plurality of insulative tubes is held in place and separated from remaining ones of the insulative tubes by a separator sleeve.

12. The tube adapter portion of claim 11, further comprising a plurality of separator sleeves, wherein each of the separator sleeves is sized to remove and receive each of the plurality of insulative tubes during repair operations or maintenance operations of the ESC.

13. The tube adapter portion of claim 11, further comprising a plurality of separator sleeves, wherein each of the separator sleeves comprises a non-conducting ceramic material.

14. The tube adapter portion of claim 11, further comprising a plurality of separator sleeves, wherein each of the separator sleeves comprises a machinable glass-ceramic material.

15. The tube adapter portion of claim 7, wherein the insulative tubes comprise a polyimide material.

16. The tube adapter portion of claim 7, further comprising a dielectric coating formed on an inner surface of the tube adapter portion configured to prevent arcing between high voltage electrodes within the tube adapter portion and a main body of the tube adapter portion during an operation of the plasma-based processing system.

17. A tube adapter portion for use in an electrostatic chuck (ESC) assembly of a plasma-based processing system, the tube adapter portion comprising:
   a plurality of insulative tubes within the tube adapter portion, each of the plurality of insulative tubes configured to be coupled to a respective conductive rod, each of plurality of insulative tubes extending to at least distal of the tube adapter portion to a point at which arcing between the respective conductive rod within a respective one of the plurality of insulative tubes and grounded surfaces of the tube adapter portion cannot occur; and
   an enlarged gap portion of the tube adapter portion proximate outboard ones of the conductive rods and above the plurality of insulative tubes, a dimension of the enlarged gap portion being configured to prevent arcing between a high voltage signal carried by respective ones of the conductive rods and a main body of the tube adapter portion during operation of the plasma-based processing system.

18. The tube adapter portion of claim 17, wherein the ESC assembly further comprises a pedestal that is mechanically-coupled to the tube adapter portion.

19. The tube adapter portion of claim 18, wherein the tube adapter portion is configured to be retrofit with the pedestal of an existing plasma-based processing system.

20. The tube adapter portion of claim 1, further comprising:
   at least one gas-purging line.

21. The tube adapter portion of claim 1, wherein the plurality of insulative tubes extend below a lower portion of the tube adapter protion.

* * * * *